(12) United States Patent
Zhang et al.

(10) Patent No.: US 10,854,467 B2
(45) Date of Patent: Dec. 1, 2020

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Hai Yang Zhang, Shanghai (CN); Yan Wang, Shanghai (CN); Xin Jiang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/057,255

(22) Filed: Aug. 7, 2018

(65) Prior Publication Data

US 2019/0057876 A1 Feb. 21, 2019

(30) Foreign Application Priority Data

Aug. 16, 2017 (CN) .......................... 2017 1 0701851

(51) Int. Cl.
*H01L 21/308* (2006.01)
*H01L 21/02* (2006.01)
*H01L 21/311* (2006.01)

(52) U.S. Cl.
CPC ...... *H01L 21/3088* (2013.01); *H01L 21/0217* (2013.01); *H01L 21/0228* (2013.01); *H01L 21/02118* (2013.01); *H01L 21/02164* (2013.01); *H01L 21/02205* (2013.01); *H01L 21/02271* (2013.01); *H01L 21/3081* (2013.01); *H01L 21/3086* (2013.01); *H01L 21/31116* (2013.01)

(58) Field of Classification Search
CPC .................................................... H01L 21/3088
See application file for complete search history.

(56) References Cited

U.S. PATENT DOCUMENTS

| 9,263,290 B2* | 2/2016 | Bergendahl ......... H01L 21/3086 |
| 9,620,380 B1* | 4/2017 | Dai ..................... H01L 29/6656 |
| 10,211,062 B2* | 2/2019 | Zhang ................. H01L 21/0337 |

(Continued)

FOREIGN PATENT DOCUMENTS

| CN | 103632928 A | 3/2014 |
| CN | 105895510 A | 8/2016 |
| CN | 107039265 A | 8/2017 |

*Primary Examiner* — Abul Kalam
(74) *Attorney, Agent, or Firm* — Anova Law Group, PLLC

(57) ABSTRACT

A semiconductor device and fabrication method thereof are provided. The fabrication method include: providing a to-be-etched material layer; forming a plurality of discrete sacrificial layers on the to-be-etched material layer; forming first initial spacers on sidewalls of each sacrificial layer, where each first initial spacer includes a first bottom region and a first top region on the first bottom region; removing the sacrificial layers; removing the first bottom region of the first initial spacer to form a first spacer from the first top region; forming second spacers on sidewalls of each first spacer; removing the first spacer; and etching the to-be-etched material layer by using the second spacers as an etch mask.

11 Claims, 7 Drawing Sheets

(56) References Cited

U.S. PATENT DOCUMENTS

| | | | |
|---|---|---|---|
| 10,361,286 B2* | 7/2019 | Tseng | H01L 29/6656 |
| 2015/0318181 A1* | 11/2015 | Cantone | H01L 21/823431 |
| | | | 438/702 |
| 2016/0027655 A1* | 1/2016 | Chen | C23C 16/45544 |
| | | | 438/703 |
| 2016/0099217 A1* | 4/2016 | Peng | H01L 21/76838 |
| | | | 257/797 |
| 2016/0225640 A1* | 8/2016 | Raley | H01L 21/31144 |
| 2016/0233104 A1 | 8/2016 | Kim et al. | |
| 2016/0240386 A1* | 8/2016 | Syun | H01L 21/0206 |
| 2017/0221902 A1* | 8/2017 | Kang | H01L 27/10879 |
| 2017/0372974 A1* | 12/2017 | Tseng | H01L 29/6653 |
| 2019/0067008 A1* | 2/2019 | Chen | H01L 23/481 |
| 2019/0271918 A1* | 9/2019 | Sun | H01L 21/0337 |

* cited by examiner

SEMICONDUCTOR DEVICE AND FABRICATION METHOD THEREOF

CROSS-REFERENCES TO RELATED APPLICATION

This application claims the priority of Chinese Patent Application No. 201710701851.2, filed on Aug. 16, 2017, the content of which is incorporated herein by reference in its entirety.

TECHNICAL FIELD

The present disclosure generally relates to the field of semiconductor fabrication technologies and, more particularly, relates to a semiconductor device and its fabrication method.

BACKGROUND

In a semiconductor fabrication process, patterns on masks are usually transferred to substrates by photolithographic processes. A typical photolithographic process includes: providing a semiconductor substrate; forming a photoresist on the semiconductor substrate; exposing and developing the photoresist to form a patterned photoresist by transferring a pattern in a mask to the photoresist; etching the semiconductor substrate by using the patterned photoresist as a mask to transfer the pattern in the patterned photoresist to the semiconductor substrate; and removing the photoresist. As critical dimensions of semiconductor devices continuously decrease, critical dimensions of the photolithographic process approach and even exceed physical limits of the photolithographic process, which impose a more serious challenge on the photolithographic technology. To solve these problems, a double patterning technology uses two patterning processes to form a final pattern. The physical limits of the photolithographic process in a single patterning process are overcome.

A self-aligned double patterning technology (SADP) is one of the important double patterning technologies. A self-aligned double patterning process may include: proving a to-be-etched material layer; forming a sacrificial material layer on the to-be-etched material layer; patterning the sacrificial material layer by a photolithographic process to form a sacrificial layer; depositing a pitch spacer material layer on the sacrificial layer and on the to-be-etched material layer; etching the pitch spacer material layer to at least expose a top surface of the sacrificial layer and to form pitch spacers on sides of the sacrificial layer; removing the sacrificial layer to preserve the pitch spacers; and etching the to-be-etched material layer by using the pitch spacers as a mask.

Based on the self-aligned double patterning technology, a self-aligned quadruple patterning (SAQP) technology is used to achieve a finer resolution and to further improve a critical density of a semiconductor device.

However, performances of patterns in the semiconductor devices formed by the self-aligned quadruple patterning technology still need to be improved. The disclosed devices and methods are directed to at least partially alleviate one or more problems set forth above and to solve other problems in the art.

SUMMARY

One aspect of the present disclosure provides a fabrication method of a semiconductor device. The method includes: providing a to-be-etched material layer; forming a plurality of discrete sacrificial layers on the to-be-etched material layer; forming first initial spacers on two sidewalls of each sacrificial layer, where each first initial spacer includes a first bottom region and a first top region on the first bottom region; removing the sacrificial layers; removing the first bottom region of each first initial spacer to form a first spacer from each first bottom region; forming second spacers on sidewalls of each first spacer; removing the first spacers; and etching the to-be-etched material layer by using the second spacers as a mask.

Another aspect of the present disclosure provides a semiconductor device fabricated by the disclosed method.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

FIG. 1 to FIG. 5 illustrate semiconductor structures corresponding to certain stages for forming an exemplary semiconductor device.

Figure 1:
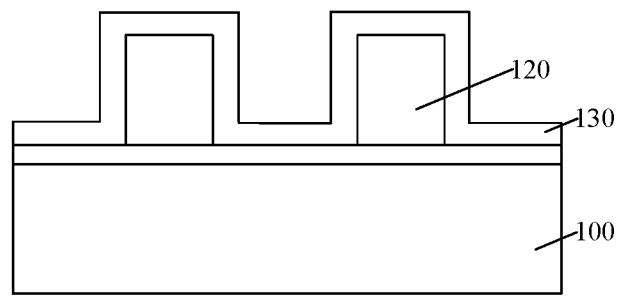
FIGS. 1-5 illustrate semiconductor structures corresponding to certain stages for forming a semiconductor device.

Referring to FIG. 1, a to-be-etched material layer 100 may be provided. Then a plurality of discrete sacrificial layers 120 may be formed on the to-be-etched material layer 100. Subsequently, a first spacer material film 130 may be formed on the to-be-etched material layer 100, on top surfaces of the sacrificial layers 120, and on sidewalk of the sacrificial layers 120.

Figure 2:
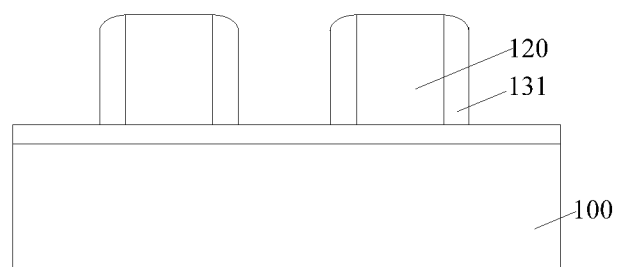

Referring to FIG. 2, the first spacer material film 130 may be etched by an anisotropic dry etching process, to form first spacers 131 on sides of each sacrificial layer 120.

Figure 3:
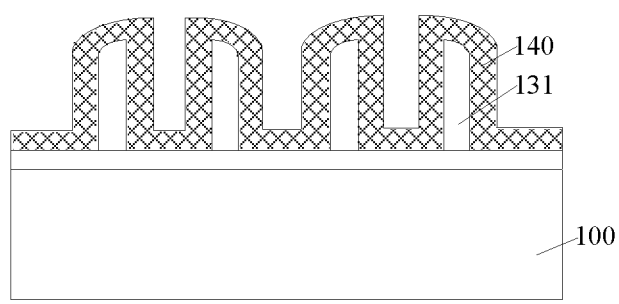

As illustrated in FIG. 3, the sacrificial layers 120 may be removed. Then a second spacer material film 140 may be formed on the to-be-etched material layer 100, on the sidewalls of the first spacers 131, and on top surfaces of the first spacers 131.

Figure 4:
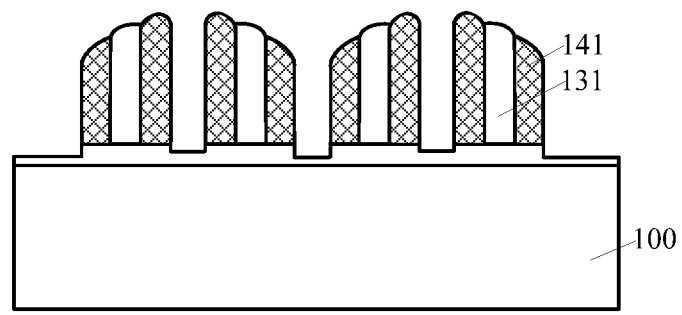

As illustrated in FIG. 4, the second spacer material film 140 may be etched by an anisotropic dry etching process to form second spacers 141 on sides of each first spacer 131.

Figure 5:
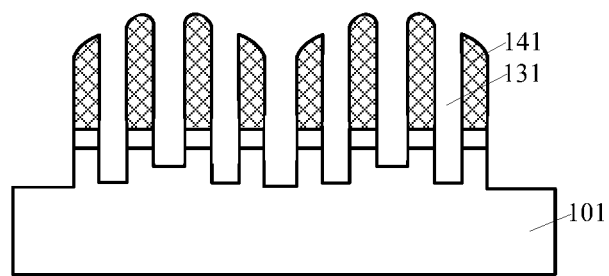

As illustrated in FIG. 5, the first spacers 131 may be removed. Then the to-be-etched material layer 100 may be etched by using the second spacers 141 as a mask, to form a target layer 101.

In the above method, the first spacer material film 130 may be etched by the anisotropic dry etching process to form first spacers 131 on sides of each sacrificial layer 120. Each first spacer 131 has a first sidewall and a second sidewall opposite to each other. The first sidewall is lower than the second sidewall because of shadow effects in the anisotropic dry etching process for etching the spacer material film 130. After forming the second spacer material film 140, a first portion of the second spacer material film 140 on the first sidewalls of the first spacers 131 is lower than a second portion of the second spacer material film 140 on the second sidewalk of the first spacers 131. When etching the second spacer material film 140 by the anisotropic dry etching process, a distribution of an etching gas is affected by the height of the second spacer material film 140 on the first sidewall and on the second sidewall of the first spacer 131. Correspondingly, a concentration of the etching gas between two adjacent first sidewalls of the first spacers 131 is higher than the concentration of the etching gas between two adjacent second sidewalls of the first spacers 131. The second spacer material film 140 between two adjacent first sidewalls of the first spacers 131 has a first etching rate in a normal direction of a surface of the to-be-etched material layer 100, while the second spacer material film 140 between two adjacent second sidewalk of the first spacers 131 has a second etching rate in the normal direction of the surface of the to-be-etched material layer 100. The first etching rate is larger than the second etching rate. Correspondingly, after forming the second spacers 141, a surface height of materials on two sides of a first spacer 131 and a height of the second spacers 141 have a large difference. It is difficult to make a difference between a height of a material covered by the first spacers 131 and a height of the material on two sides of the first spacers 131, and a difference between a height of a material covered by the first spacers 131 and a height of the material on two sides of the second spacers 141 small simultaneously. Subsequently, the height of the material on the two sides of the second spacers 141 has a big variation after removing the first spacers 131. After the to-be-etched material layer 100 is etched by using the second spacers 141 as the mask, a difference between heights of recesses in the to-be-etched material layer 100 is large. The patterns in the formed semiconductor structure have poor performances.

The present disclosure provides a semiconductor device and its fabricating method. The method of the present disclosure includes: removing first top regions after removing the sacrificial layers to form the first spacers from first bottom regions; forming second spacers on sidewalls of each first spacer; removing the first spacers; and etching the to-be-etched material layer by using the second spacers as the mask.

FIG. 6 to FIG. 19 illustrate semiconductor structures corresponding to certain stages for forming an exemplary semiconductor device according to one of the disclosed embodiments of present disclosure.

Figure 6:
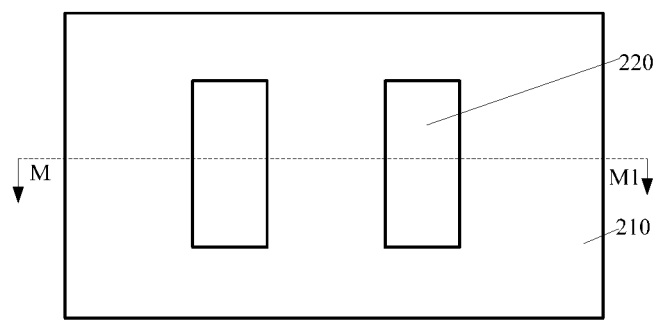
FIGS. 6-19 illustrate semiconductor structures corresponding to certain stages in a method for forming an exemplary semiconductor device according to various disclosed embodiments of the present disclosure.
Figure 7:
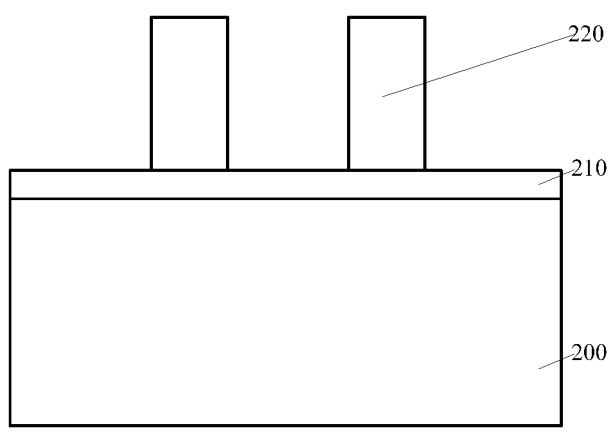
Figure 23:
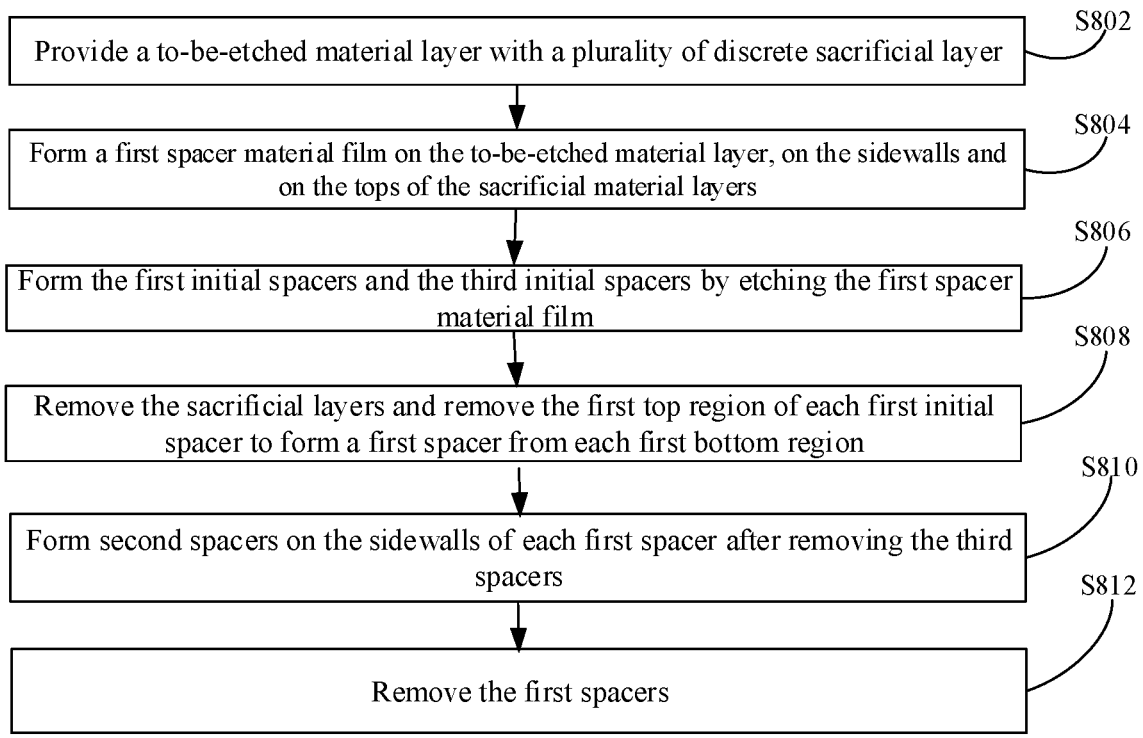
FIG. 23 illustrates an exemplary method for forming a semiconductor device according to various disclosed embodiments.

Referring to FIG. 6 and FIG. 7 which is the cross-sectional view of the structure along the M-M1 direction in FIG. 6, a to-be-etched material layer 200 may be provided and a plurality of discrete sacrificial layer 220 may be formed on the to-be-etched material layer 200 (e.g., in Step S802 in FIG. 23).

The to-be-etched material layer 200 may be a material layer which will be etched subsequently. The to-be-etched material layer 200 may have a single layer structure or a multilayer structure, and may be made of a semiconductor material including silicon, germanium, and/or SiGe. In one embodiment, the to-be-etched material layer 200 may be made of silicon. Various semiconductor structure such as a PMOS transistor, an NMOS transistor, a resistance and a capacitance, may be formed in the to-be-etched material layer 200.

The sacrificial layers 220 may be made of polysilicon or amorphous carbon, and may be different from the materials of first initial spacers to be formed. So the sacrificial layers 220 and the first initial spacers may have different etching rates when removing the sacrificial layers 220.

The sacrificial layers 200 may be formed by: forming a sacrificial material layer (not shown in the figures) on the to-be-etched material layer 200; forming a mask layer (not shown in the figures) on the sacrificial material layer; and etching the sacrificial material layer by an anisotropic dry etching method using the mask layer as a mask, to form the sacrificial layers 200.

In one embodiment, an etching barrier layer 210 may be formed on the surface of the to-be-etched material layer 200, and the sacrificial layers 200 may be formed on a surface of the etching barrier layer 210. In another embodiment, the etching barrier layer 210 may not be formed, and the sacrificial layers 200 may be directly formed on the surface of the to-be-etched material layer 200. The etching barrier layer 210 may be made of a material including AlN and/or BN. The etching barrier layer 210 may be formed by a deposition method including a sputtering deposition method, a plasma chemical vapor deposition method, a low-pressure chemical vapor deposition method, and a sub-atmosphere-pressure chemical vapor deposition method.

When etching a first spacer material film to form first spacers subsequently, the etching barrier layer 210 may have an etching rate smaller than the first spacer material film, and may be used to stop the etching process.

When etching a first spacer material film to form first spacers subsequently, an etching selecting ratio of the first spacer material film relative to the etching barrier layer 210 may have a value larger than or equal to 10. Correspondingly, the etching selecting ratio of the first spacer material film relative to the etching barrier layer 210 may be high, and consumptions of the etching barrier layer 210 may be small when forming the first spacers. The etching barrier layer 210 could have a small thickness. In one embodiment, the thickness of the etching barrier layer 210 may be about 10 Å to about 100 Å.

In one embodiment, a bottom barrier layer (not shown in the figures) may be formed between the to-be-etched material layer 200 and the etching barrier layer 210. The bottom barrier layer may be made of a material including $SiN_x$ and/or $SiN_xO_y$. The bottom barrier layer may be formed by a deposition method including a sputtering deposition method, a plasma chemical vapor deposition method, a low-pressure chemical vapor deposition method and a sub-atmosphere-pressure chemical vapor deposition method. The bottom barrier layer may provide a good basis material to form the etching barrier layer 210. Then a film quality of the etching barrier layer 210 may be improved. Correspondingly, the etching barrier layer 210 may not need a large thickness to compensate defects of the etching barrier layer 210. In other embodiments, the bottom barrier layer may not be formed.

Subsequently, the first initial spacers may be formed on sides of each sacrificial layer 220. Each first initial spacer may include a first bottom region and a first top region on the first bottom region.

In one embodiment, third initial spacers may be also formed on sides of each sacrificial layer 220 when forming the first initial spacers. Two ends of each third initial spacer may be connected to an adjacent first initial spacer respectively. The third initial spacers and the first initial spacers may together form a ring structure. Each third initial spacer may include a third bottom region and a third top region on the third bottom region. A top of the third bottom region may be coplanar with a top of the first bottom region.

Figure 8:
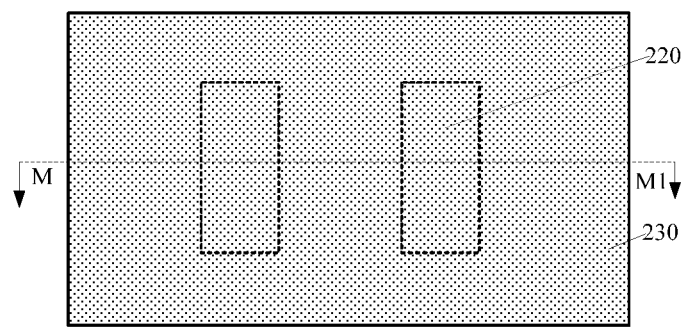
Figure 9:
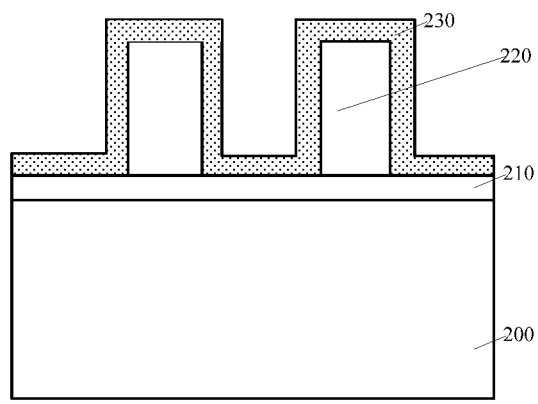

Referring to FIG. 8 and FIG. 9, a first spacer material film 230 may be formed on the to-be-etched material layer 200, on the sidewalls of the sacrificial layers 220, and on the top surfaces of the sacrificial layers 220 (e.g., in Step S804 in FIG. 23). FIG. 8 is based on FIG. 6. FIG. 9 is based on FIG. 7 and is a cross-sectional view along the M-M1 direction in FIG. 8.

In one embodiment, the first spacer material film 230 may be formed on the etching barrier layer 210.

The first spacer material film 230 may be made of a material including $SiO_2$ and/or $SiN_x$. The first spacer material film 230 may be formed by a deposition method including as a sputtering deposition method, a plasma chemical vapor deposition method, a low-pressure chemical vapor deposition method, and a sub-atmosphere-pressure chemical vapor deposition method.

For displaying purpose only, a portion of the first spacer material film 230 is not shown in FIG. 8 so a portion of the top surfaces of the sacrificial layers 220 is exposed.

Figure 10:
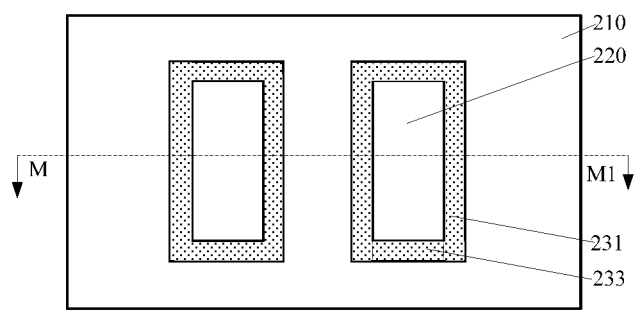
Figure 11:
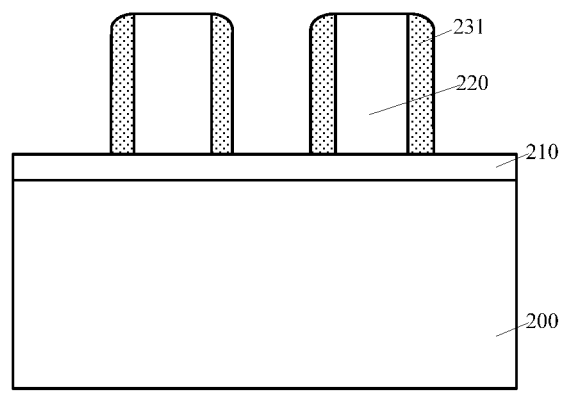

Referring to FIG. 10 and FIG. 11, the first spacer material film 230 may be etched to form the first initial spacers 231 and the third initial spacers 233 (e.g., in Step S806 in FIG. 23). FIG. 10 is based on FIG. 8. FIG. 11 is based on FIG. 9 and is a cross-sectional view along the M-M1 direction in FIG. 10.

The first spacer material film 230 may be etched by an anisotropic dry etching method including an anisotropic plasma etching method and/or a reactive ion etching method. In one embodiment, the first spacer material film 230 may be etched until exposing the etching barrier layer 210, to form the first initial spacers 231 and the third initial spacers 233.

An etching selective ratio between the first spacer material film 230 and the etching barrier layer 210 may be larger than or equal to 10, when etching the first spacer material film 230 to form the first initial spacers 231 and the third initial spacers 233. Correspondingly, an etching selectivity ratio between the first spacer material film 230 and the etching barrier layer 210 may be large, and an etching consumption of the etching barrier layer 210 may be small. Then a height difference between the top surface of the etching barrier layer 210 covered by the sacrificial layers 220, and the top surface of the etching barrier layer 210 exposed by the first initial spacers 231 and the third initial spacers 233, may be small.

The first initial spacers 231 and the third initial spacers 233 may also be located on the etching barrier layer 210. Two ends of each third initial spacer 233 may be connected to an adjacent first initial spacer 231 respectively. The third initial spacers 233 and the first sidewalls 231 may together form a ring structure.

In one embodiment, a sacrificial layer 220 may have a rectangular shape, and correspondingly the third initial spacers 233 and the first sidewalls 231 may together form a rectangular ring structure. In another embodiment, the shape of the sacrificial layer 220 may be a cube, and correspondingly the third initial spacers 233 and the first sidewalls 231 may together form a square ring structure. In other embodiments, the third initial spacers 233 and the first sidewalls 231 may together form a circular ring structure or an irregular ring structure, according to the shapes of the sacrificial layer 220.

In a pattern of the first initial spacers 231 projected on the surface of the to-be-etched material layer 200, a length direction of the projection pattern may be along an extension direction of the first initial spacers 231. In a pattern of the third initial spacers 233 projected on the surface of the to-be-etched material layer 200, a length direction of the projection pattern may be an extension direction of the third initial spacers 233.

Each first initial spacer 231 may include a first bottom region and a first top region on the first bottom region. Each third initial spacer may include a third bottom region and a third top region on the third bottom region. A top of the third bottom region may be coplanar with a top of the first bottom region.

In one embodiment, in a direction perpendicular to the top surface of the to-be-etched material layer 200, a size of the first top region may be about 10% to about 20% of a size of the first bottom region.

Figure 12:
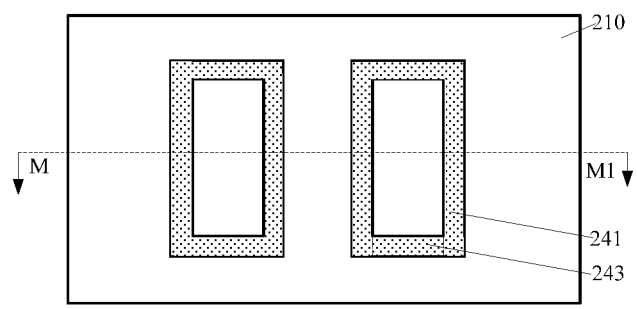
Figure 13:
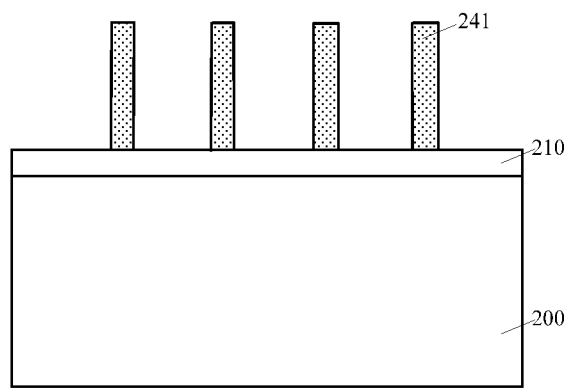

Referring to FIG. 12 and FIG. 13, the sacrificial layers 220 may be removed after forming the first initial spacers 231, and then the first top regions of the first initial spacers 231 may be removed to form first spacers 241 from the first bottom regions (e.g., in Step S808 in FIG. 23). FIG. 12 is based on FIG. 10, while FIG. 13 is based on FIG. 11 and is a cross-sectional view along the M-M1 direction in FIG. 12.

In one embodiment, the sacrificial layers 220 may be removed after forming the first initial spacers 231 and the third initial spacers 233.

In one embodiment, the third top regions of the third initial spacers 233 may also be removed to form third spacers 243 from the third bottom regions, when removing the first top regions.

There may be first recesses between two adjacent first initial spacers 231 and between two adjacent third initial spacers 233, after removing the sacrificial layers 220 but before forming the first spacers 241 and the third spacers 243.

A process to remove the first top regions and the third top regions may include: forming a first barrier layer (not shown in the figures) on the first initial spacers 231, on the third initial spacers 233, in the first recesses and on the first recesses, after removing the sacrificial layer 220; etching back the first barrier layer, the first initial spacers 231 and the third initial spacers 233, until the first top regions and the third top regions are removed; and removing the first barrier layer.

The first barrier layer may be made of a material including fluorocarbon polymers, hydrofluorocarbon polymers and/or carbonitride polymers. The first barrier layer may be formed in a dry etching station.

When the first barrier layer is made of fluorocarbon polymers, a process for forming the first barrier layer may use: a gas including a fluorocarbon gas, a hydrofluorocarbon gas, $Cl_2$ and/or Ar; a flow rate of the fluorocarbon gas of about 10 sccm to about 500 sccm; a flow rate of the hydrofluorocarbon gas of about 10 sccm to about 500 sccm; a flow rate of $Cl_2$ of about 10 sccm to about 500 sccm; a flow rate of Ar of about 10 sccm to about 500 sccm; a power of the plasma source of about 400 W to about 2000 W; a bias power of about 0 W; a temperature of about 30° C. to about 90° C. When the first barrier layer is made of carbonitride polymers, the process for forming the first barrier layer may use: a gas including $CH_4$ and $N_2$; a flow rate of $CH_4$ of about 10 sccm to about 500 sccm; a flow rate of $N_2$ of about 10 sccm to about 500 sccm; a plasma source with a power of about 200 W to about 2000 W; a bias power of about 0 W to about 500 W; and a temperature of about 0° C. to about 80° C.

In one embodiment, the first initial spacers 231 and the third initial spacers 233 may be made of $SiO_2$. Correspondingly, the first barrier layer, the first initial spacers 231 and the third initial spacers 233 may be etched back by a dry etching method. The dry etching process may use: a gas including $CF_4$ with a flow rate of about 50 sccm to about 500 sccm, $CH_2F_2$ with a flow rate of about 10 sccm to about 100 sccm, $CH_3F$ with a flow rate of about 0 sccm to about 100 sccm, $O_2$ with a flow rate of about 10 sccm to about 100 sccm, and/or Ar with a flow rate of about 50 sccm to about 500 sccm; a RF source with a power of about 100 W to about 2000 W; a bias voltage of about 0 V to about 500 V; and a pressure of the chamber of about 5 mtorr to about 200 mtorr.

Since the first top regions with rough surfaces may be removed and first spacers 241 may be formed from the first bottom regions, top surfaces of the first spacers 241 may have a good flatness.

Figure 14:
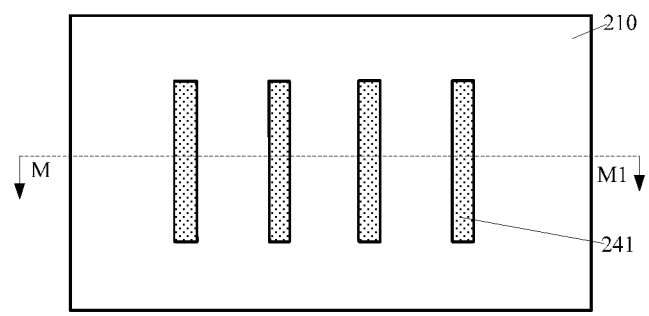

Referring to FIG. 14 which is based on FIG. 12, the third spacers 243 may be removed (e.g., in Step S810 in FIG. 23).

In one embodiment, the third spacers 243 and a portion of the first spacers 241 connected to the third spacers 243 may be removed. In other embodiments, only the third spacers 243 may be removed. The present disclosure will be described by using an embodiment where the third spacers 243 and the portion of the first spacers 241 connected to the third spacers 243 may be removed, as an example.

In one embodiment, the third spacers 243 and the portion of the first spacers 241 connected to the third spacers 243 may be removed by a first directed ribbon-beam plasma etching process.

Figure 15:
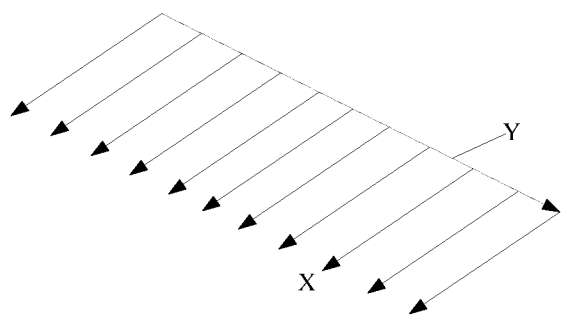

As illustrated in FIG. 15, the first directed ribbon-beam plasma etching process may have an injection direction X, and there is a first injection angle between the injection direction X and a normal direction of the surface of the to-be-etched material layer 200. The first directed ribbon-beam plasma etching process also may have a ribbon extension direction Y. The ribbon extension direction Y may be perpendicular to the injection direction X and parallel to the sidewalls of the third spacers 243.

In the first directed ribbon-beam plasma etching process, a plasma source chamber may produce plasma sources. The plasma sources may be extracted from the plasma source chamber by a ribbon slit to form a ribbon-beam plasma. The ribbon-beam plasma may enter the process chamber where all material layers to-be-etched are located. Since there is the first injection angle between the injection direction X and a normal direction of the surface of the to-be-etched material layer 200, a component of the injection direction of the ribbon-beam plasma in a direction parallel to the surface of the to-be-etched material layer 200 may be used to etch the materials which need to-be-etched. In the first ribbon-beam plasma etching process, the extension direction of the ribbon in the ribbon-beam plasma may be parallel to the sidewalls of the third spacers 243, and the component of injection direction of the ribbon-beam plasma in the direction parallel to the surface of the to-be-etched material layer 200 may be used to etch the third spacers 243 and to remove the third spacers 243.

In the first ribbon-beam plasma etching process, the third spacers 243 may be removed without the lithographical process and the process may be simplified then.

The first ribbon-beam plasma etching process may use: a gas including $CF_4$ with a flow rate of about 50 sccm to about 500 sccm, $CH_2F_2$ with a flow rate of about 0 sccm to about 100 sccm, and $O_2$ with a flow rate of about 10 sccm to about 100 sccm; a RF source with a power of about 100 W to about 2000 W; a bias voltage of about 0 V to about 500 V; a pressure of the chamber of about 5 mtorr to about 200 mtorr; the first injection angle of about 20° to about 50°; and the first extension direction of the ribbon parallel to the sides of the third spacers 243.

The first extension direction of the ribbon may be parallel to an extending direction of the third spacers 243.

In other embodiments, the third spacers 243 may be removed by a lithographical process.

Figure 16:
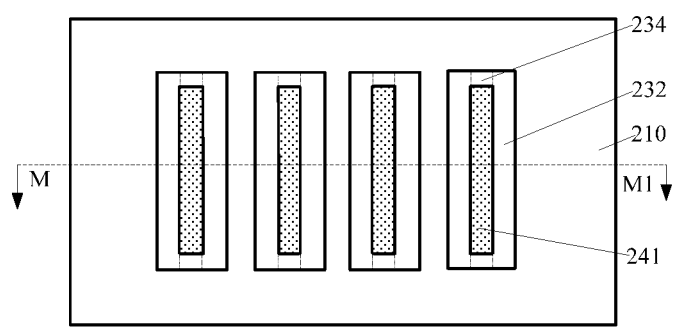
Figure 17:
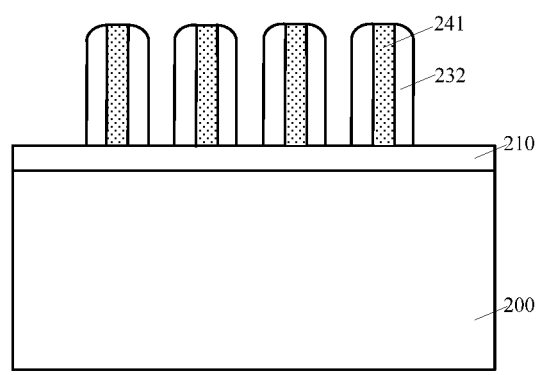

Referring to FIG. 16 and FIG. 17, second spacers 232 may be formed on sidewalls of each first spacer 241 (e.g., in Step S812 in FIG. 23). FIG. 16 is based on FIG. 14, while FIG. 17 is a cross-sectional view along the M-M1 direction in FIG. 16.

Each second spacer 232 may include a second bottom region and a second top region on the second bottom region.

The second spacers 232 may be formed after removing the third spacers 243.

In one embodiment, the process may further include forming fourth spacers 234 on two sidewalls of each first spacer 241 when forming the second spacers 232. Two ends of each fourth spacer 234 may be connected to an adjacent second spacer 232 respectively. The fourth spacers 234 and the second spacers 232 may together form a ring structure. Each fourth spacer 234 may include a fourth bottom region and a fourth top region on the second bottom region. A top of each fourth bottom region may be coplanar with a top of each second bottom region.

The second spacers 232 and the fourth spacers 234 may be formed by: forming a second spacer material film on the to-be-etched material layer 200, on the sidewalls of the first spacers 241, and on the tops of the first spacers 241; and etching back the second spacer material film to form the second spacers 232 and the fourth spacers 234.

The second spacer material film may be made of a material including $SiO_2$ and/or $SiN_x$, and the material of the second spacer material film may be different from the first spacer material film 230. In one embodiment, the second spacer material film may also be formed on the etching barrier layer 210.

The second spacer material film may be formed by a deposition including a sputtering deposition method, a plasma chemical vapor deposition method, a low-pressure chemical vapor deposition method and a sub-atmosphere-pressure chemical vapor deposition method. The second spacer material film may be etched back by an anisotropic dry etching method including an anisotropic plasma etching method and a reactive ion etching method.

In one embodiment, the second spacer material film may be etched back until exposing the etching barrier layer 210, to form the second spacers 232 and the fourth spacers 234.

An etching selectivity ratio between the second spacer material film and the etching barrier layer 210 may be larger than or equal to 10, when etching the second spacer material film to form the second spacers 232 and the fourth spacers 234. So the etching selectivity ratio between the second spacer material film and the etching barrier layer 210 may be large, and an etching consumption of the etching barrier layer 210 may be small. Correspondingly, a height difference between the top surface of the etching barrier layer 210 covered by the first spacers 241, and the top surface of the etching barrier layer 210 exposed by the second spacers 232 and the fourth spacers 234, may be small.

The second spacers 232 and the fourth spacers 234 may also be formed on the etching barrier layer 210.

Two ends of each fourth spacer 234 may be connected to an adjacent second spacer 232 respectively. The fourth spacers 234 and the second spacers 232 may together form a ring structure including a rectangular ring structure, a square ring structure, a circular ring structure and/or an irregular ring structure.

In a pattern of the second spacers 232 projected on the surface of the to-be-etched material layer 200, a length direction of the projection pattern is an extension direction of the second spacers 232. In a pattern of the fourth spacers 234 projected on the surface of the to-be-etched material layer 200, a length direction of the projection pattern is an extension direction of the fourth spacers 234.

In one embodiment, a size of the second top regions along a direction perpendicular to the top surface of the to-be-etched material layer 200 may be about 10% to about 20% of a size of the second bottom regions.

After forming the second spacers 232 on two sidewalls of the first spacers, the height of the adjacent second spacers 232 may be relatively consistent, and a variation of the height of the materials on both sidewalls of the second spacers 232 and on both sides of the first spacers 241 may be small. Correspondingly, a variation of the height of the materials covering the first spacers 241, the materials on two sidewalls of the second spacers 232 and the material on two sidewalls of the first spacers 241 may be small.

Figure 18:
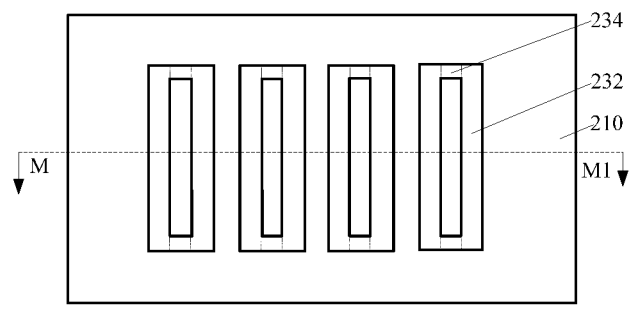
Figure 19:
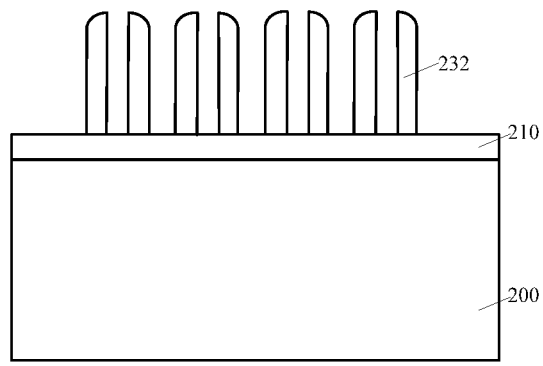

Referring to FIG. 18 and FIG. 19, the first spacers 241 may be removed after forming the second spacers 232 and the fourth spacers 234 (e.g., in Step S814 in FIG. 23). FIG. 18 is based on FIG. 16, while FIG. 19 is based on the FIG. 17 and is a cross-sectional view along the M-M1 direction in FIG. 18.

In one embodiment, the first spacers 241 may be made of $SiO_2$, and the second spacers 232 may be made of $SiN_x$. Correspondingly, the first spacers 241 may be removed by a dry etching process. The dry etching process may use: a gas including $C_5HF_7$ with a flow rate of about 50 sccm to about 200 sccm, $O_2$ with a flow rate of about 10 sccm to about 50 sccm, and Ar with a flow rate of about 50 sccm to about 200 sccm; a RF source with a power of about 500 W to about 1000 W; and a pressure of about 5 mtorr to about 200 mtorr.

In one embodiment, when the first spacers 241 are removed using above process parameters, the first spacers 241 may have an etching rate larger than the second spacers 232. Then the etching process may consume a small amount of the second spacers 232. Similarly, the etching process may consume a small amount of the fourth spacers 234 when removing the first spacers 241.

A height difference of the materials on two sides of the second spacers 232 may be small after removing the first spacers 241.

The method may further include etching the to-be-etched material layer 200 by using the second spacers 232 as a mask, after removing the first spacers 241.

In one embodiment, the process may further include etching the etching barrier layer 210 and the bottom barrier layer by using the second spacers 232 as a mask, after removing the first spacers 241 but before etching the to-be-etched material layer 200 by using the second spacers 232 as a mask.

Since the height difference of the materials on two sides of the second spacers 232 may be small after removing the first spacers 241, the recesses in the to-be-etched material layer 200 may have a relatively consistent height and the performance of the pattern in the semiconductor structure may be improved, after etching the to-be-etched material layer 200 by using the second spacers 232 as a mask.

Various embodiments of the present disclosure also provide a semiconductor device fabricated by the disclosed methods.

Various embodiments of the present disclosure provide another method to form a semiconductor device. The difference between this method and previous method include removing the second top regions after removing the first spacers and etching the to-be-etched material layer by using the second bottom regions of the second spacers as a mask.

Figure 20:
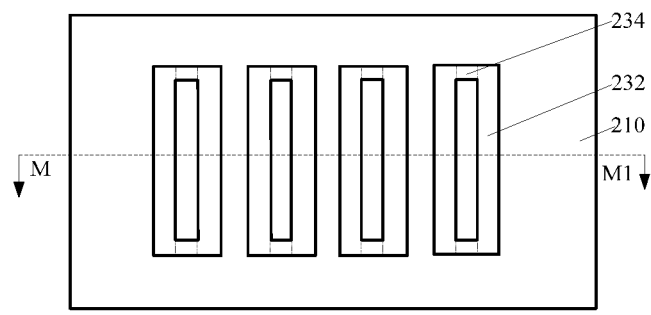
FIGS. 20-22 illustrate semiconductor structures corresponding to certain stages in another method for forming an exemplary semiconductor device according to various disclosed embodiments of the present disclosure.
Figure 21:
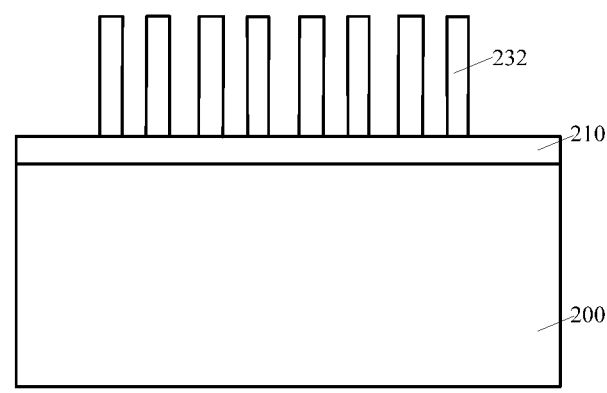
Figure 22:
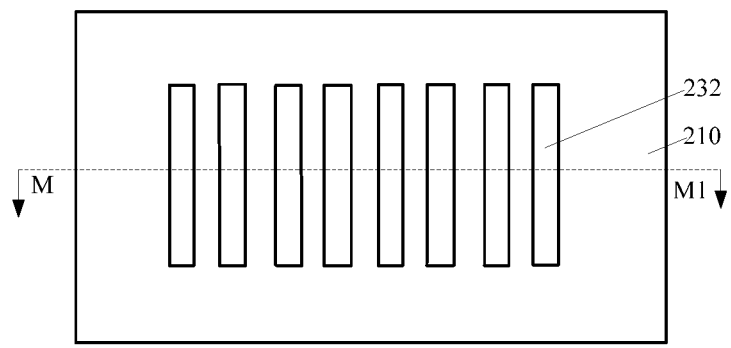

FIG. 20 to FIG. 22 illustrate semiconductor structures corresponding to certain stages for forming an exemplary semiconductor device according to one of the disclosed embodiments of present disclosure.

Referring to FIG. 20 and FIG. 21, the second top regions may be removed after removing the first spacers 241. FIG. 20 is based on FIG. 18, while FIG. 21 is based on the FIG. 19 and is a cross-sectional view along the M-M1 direction in FIG. 23.

In one embodiment, the fourth top regions may be removed when removing the second top regions.

Second recesses may be formed between two adjacent second spacers 232 and between two adjacent fourth spacers 234, after removing the first spacers 241 but before removing the second top regions and the fourth top regions. The method to removing the second and the fourth top regions may include: forming a second barrier layer (not shown in the figures) on the second spacers 232, on the fourth spacers 234, in the second recesses, and on the second recesses, after removing the sacrificial layers 220; etching the second barrier layer, the second spacers 232, and the fourth spacers 234, until the second top regions and the fourth top regions are removed; and removing the second barrier layer.

The second barrier layer may be made of a material including fluorocarbon polymers, hydrofluorocarbon polymers or carbonitride polymers. The second barrier layer may be formed in a dry etching station.

When the second barrier layer is made of fluorocarbon polymers, a process for forming the first barrier layer may use: a gas including a fluorocarbon gas, a hydrofluorocarbon gas, $Cl_2$ and/or Ar; a flow rate of the fluorocarbon gas of about 10 sccm to about 500 sccm; a flow rate of the hydrofluorocarbon gas of about 10 sccm to about 500 sccm; a flow rate of $Cl_2$ of about 10 sccm to about 500 sccm; a flow rate of Ar of about 10 sccm to about 500 sccm; a power of the plasma source of about 400 W to about 2000 W; a bias power of about 0 W; a temperature of about 30° C. to about 90° C. When the second barrier layer is made of carbonitride polymers, the process for forming the first barrier layer may use: a gas including $CH_4$ and $N_2$; a flow rate of $CH_4$ of about 10 sccm to about 500 sccm; a flow rate of $N_2$ of about 10 sccm to about 500 sccm; a plasma source with a power of about 200 W to about 2000 W; a bias power of about 0 W to about 500 W; and a temperature of about 0° C. to about 80° C.

The second barrier layer, the second spacers 232 and the fourth spacers 234 may be etched back by a dry etching method. The dry etching process may use: a gas including $CF_4$ with a flow rate of about 50 sccm to about 500 sccm, $CH_3F$ with a flow rate of about 30 sccm to about 100 sccm, $SF_6$ with a flow rate of about 10 sccm to about 100 sccm, and/or N$_2$ with a flow rate of about 10 sccm to about 100 sccm; a RF source with a power of about 100 W to about 1000 W; a bias voltage of about 50 V to about 500 V; and a pressure of the chamber of about 5 mtorr to about 200 mtorr.

Since the second top regions whose surfaces have a poor flatness may be removed, the top surfaces of the second bottom regions in the second spacers 232 may have a good flatness, and a height difference between the materials on two sides of the second spacers 232 may be small.

As illustrated in FIG. 22 which is based on FIG. 20, the fourth bottom regions of the fourth spacers 234 may be removed.

In one embodiment, the fourth bottom regions of the fourth spacers 234 and a portion of the second bottom regions in the second spacers 232 connected to the fourth bottom regions of the fourth spacers 234 may be removed. In other embodiments, only the fourth bottom regions of the fourth spacers 234 may be removed. The removing of the fourth bottom regions of the fourth spacers 234 and a portion of the second bottom regions in the second spacers 232 connected to the fourth bottom region of the fourth spacers 234, will be used to exemplify the method below.

In one embodiment, a second directed ribbon-beam plasma etching process may be used to remove the fourth bottom regions of the fourth spacers 234 and a portion of the second bottom regions in the second spacers 232 connected to the fourth bottom regions of the fourth spacers 234. The principle of the first directed ribbon-beam plasma etching process may be referred to the previous description about the principle of the first directed ribbon-beam plasma etching process.

The second directed ribbon-beam plasma etching process may have an injection direction, and there is a second injection angle between the injection direction and the normal direction of the surface of the to-be-etched material layer 200. The second directed ribbon-beam plasma etching process also may have a second ribbon extension direction.

The second ribbon-beam plasma etching process may use: a gas including CF$_4$ with a flow rate of about 50 sccm to about 500 sccm, SF$_6$ with a flow rate of about 10 sccm to about 100 sccm, and/or N$_2$ with a flow rate of about 10 sccm to about 100 sccm; a RF source with a power of about 100 W to about 1000 W; a bias voltage of about 0 V to about 500 V; a pressure of the chamber of about 5 mtorr to about 200 mtorr; the second injection angle of about 20° to about 50°; and the second extension direction of the ribbon parallel to the sidewalls of the fourth bottom regions of the fourth spacers.

The second extension direction of the ribbon may be parallel to an extending direction of the fourth bottom regions of the fourth spacers 234.

The second ribbon-beam plasma etching process may simplify the process.

In other embodiments, the fourth bottom regions of the fourth spacers 234 may be removed by a lithographical process.

After removing the fourth bottom regions of the fourth spacers 243, the to-be-etched material layer 200 may be etched by using the second bottom regions of the second spacers 232 as a mask.

In one embodiment, after removing the first spacers 241 but before etching the to-be-etched material layer 200 by using the second spacers 232 as a mask, the process may further include etching the etching barrier layer 210 and the bottom barrier layer by using the second bottom regions of the second spacers 232 as a mask.

Since the top surfaces of the second spacers 232 may have good flatness, and the height difference of the materials on two sides of the second sidewalls 242 may be small, the recesses in the to-be-etched material layer 200 may have a relatively consistent height and the performance of the pattern in the semiconductor structure may be improved, after etching the to-be-etched material layer 200 by using the second spacers 232 as a mask.

Various embodiments of the present disclosure also provide a semiconductor device fabricated by above method.

In the present disclosure, the first top regions may be removed and the first spacers may be formed from the first bottom regions. Then the top surfaces of the first spacers may have a good flatness. After forming the second spacers on the sidewalls of the first spacers, two adjacent second spacers may have a consistent height, and materials on two sides of the first spacers and materials on two sides of the second spacers may have a consistent height. Then a height difference of the materials on two sides of the first, the materials on two sides of the second spacers, and the materials covered by the first spacers may be small. After removing the first spacers, a height difference of the materials on two sides of the second spacers may be small. After etching the to-be-etched material layer by using the second spacers as a mask, a height difference of the recesses in the to-be-etched material layer may be small. The performance of the pattern in the semiconductor device may be improved.

Further, after removing the first spacers, the second top regions of the second spacers may be removed. Then the top surfaces of the second bottom regions of the second spacers may have a good flatness. After etching the to-be-etched material layer by using the second bottom regions of the second spacers as a mask, a height difference of the recesses in the to-be-etched material layer may be reduced further.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method of a semiconductor device, comprising:
    providing a to-be-etched material layer;
    forming a plurality of discrete sacrificial layers on the to-be-etched material layer;
    forming first initial spacers on sidewalls of each of the discrete sacrificial layers in an extension direction of each of the discrete sacrificial layers, wherein each first initial spacer includes a first bottom region and a first top region on the first bottom region;
    forming third initial spacers on sidewalls of each of the discrete sacrificial layers in a direction perpendicular to the extension direction of each of the discrete sacrificial layers when forming the first initial spacers, wherein the third initial spacers and the adjacent first initial spacers together form ring structures and each third initial spacer includes a third bottom region and a third top region on the third bottom region;
    removing the sacrificial layers;
    removing the first top region of each first initial spacer to form a first spacer from each first bottom region and removing the third top region of each third initial spacer to form a third spacer from each third bottom region;
    removing the third spacer and a portion of the first spacer by a first directed ribbon-beam plasma etching process;

forming second spacers on sidewalls of each first spacer after removing the third spacer;
removing the first spacers; and
etching the to-be-etched material layer by using the second spacers as a mask.

2. The method according to claim 1, wherein:
two ends of each third initial spacer are connected to an adjacent first initial spacer respectively;
a top of the third bottom region is coplanar with a top of the first bottom region; and
the third top region is removed when removing the first top region by etching, to form the third spacer from the third bottom region.

3. The method according to claim 2, wherein:
there are first recesses between adjacent first initial spacers and between adjacent third initial spacers, after removing the sacrificial layers but before forming the first spacers and the third spacers; and
a process to remove the first top region and the third top regions includes: forming a first barrier layer on the first initial spacers, on the third initial spacers, in the first recesses and on the first recesses, after removing the sacrificial layer; etching back the first barrier layer, the first initial spacers and the third initial spacers, until the first top regions and the third top regions are removed; and removing the first barrier layer.

4. The method according to claim 3, wherein:
the first barrier layer is made of fluorocarbon polymers, hydrofluorocarbon polymers, carbonitride polymers, or a combination thereof; and
the first barrier layer is formed in a dry etching station.

5. The method according to claim 4, wherein:
when the first barrier layer is made of fluorocarbon polymers, a process for forming the first barrier layer uses: a gas including a fluorocarbon gas, a hydrofluorocarbon gas, $Cl_2$ and/or Ar; a flow rate of the fluorocarbon gas of about 10 sccm to about 500 sccm; a flow rate of the hydrofluorocarbon gas of about 10 sccm to about 500 sccm; a flow rate of $Cl_2$ of about 10 sccm to about 500 sccm; a flow rate of Ar of about 10 sccm to about 500 sccm; a power of the plasma source of about 400 W to about 2000 W; a bias power of about 0 W; a temperature of about 30° C. to about 90° C.; and
when the first barrier layer is made of carbonitride polymers, the process for forming the first barrier layer uses: a gas including $CH_4$ and $N_2$; a flow rate of $CH_4$ of about 10 sccm to about 500 sccm; a flow rate of $N_2$ of about 10 sccm to about 500 sccm; a plasma source with a power of about 200 W to about 2000 W; a bias power of about 0 W to about 500 W; and a temperature of about 0° C. to about 80° C.

6. The method according to claim 3, wherein:
the first initial spacers and the first spacers are made of $SiO_2$; and
the third initial spacers and the third spacers are made of $SiO_2$.

7. The method according to claim 6, wherein:
the first barrier layer, the first initial spacers and the third initial spacers are etched back by a dry etching method; and
the dry etching process uses: a gas including $CF_4$ with a flow rate of about 50 sccm to about 500 sccm, $CH_2F_2$ with a flow rate of about 10 sccm to about 100 sccm, $CH_3F$ with a flow rate of about 0 sccm to about 100 sccm, $O_2$ with a flow rate of about 10 sccm to about 100 sccm, and/or Ar with a flow rate of about 50 sccm to about 500 sccm; a RF source with a power of about 100 W to about 2000 W; a bias voltage of about 0 V to about 500 V; and a pressure of the chamber of about 5 mtorr to about 200 mtorr.

8. The method according to claim 6, wherein:
the first directed ribbon-beam plasma etching process has an injection direction, and the injection direction and a normal direction of the surface of the to-be-etched material layer forms a first injection angle; and
the first ribbon-beam plasma etching process uses: a gas including $CF_4$ with a flow rate of about 50 sccm to about 500 sccm, $CH_2F_2$ with a flow rate of about 0 sccm to about 100 sccm, and $O_2$ with a flow rate of about 10 sccm to about 100 sccm; a RF source with a power of about 100 W to about 2000 W; a bias voltage of about 0 V to about 500 V; a pressure of the chamber of about 5 mtorr to about 200 mtorr; the first injection angle of about 20° to about 50°; and a first extension direction of the ribbon parallel to the sides of the third spacers 243.

9. The method according to claim 2, wherein:
the first initial spacers and the third initial spacers are formed by:
forming a first spacer material film on the to-be-etched material layer, on the sidewalls of the sacrificial layers, and on the top surfaces of the sacrificial layers; and
etching back the first spacer material film to form the first initial spacers and the third initial spacers.

10. The method according to claim 9, wherein:
the first spacer material film is formed by a method including an atomic layer deposition method.

11. The method according to claim 1, wherein:
two adjacent second spacers have a same height.

* * * * *